US011702020B2

(12) United States Patent
Naizghi et al.

(10) Patent No.: US 11,702,020 B2
(45) Date of Patent: Jul. 18, 2023

(54) REDUNDANT POWER BRIDGE BATTERY ARCHITECTURE

(71) Applicant: TUSIMPLE, INC., San Diego, CA (US)

(72) Inventors: Esayas Naizghi, Tucson, AZ (US); Jade E. Day, Tucson, AZ (US); Jeffrey J. Renn, Tucson, AZ (US); Jonathan P. Schallert, Tucson, AZ (US); Venkata Satya R. Kosuru, San Diego, CA (US); Qunfang Liao, San Diego, CA (US)

(73) Assignee: TUSIMPLE, INC., San Diego, CA (US)

( * ) Notice: Subject to any disclaimer, the term of this patent is extended or adjusted under 35 U.S.C. 154(b) by 150 days.

(21) Appl. No.: 17/185,578

(22) Filed: Feb. 25, 2021

(65) Prior Publication Data

US 2022/0266777 A1 Aug. 25, 2022

(51) Int. Cl.
*B60R 16/023* (2006.01)
*G01R 31/00* (2006.01)
(Continued)

(52) U.S. Cl.
CPC ........ *B60R 16/0238* (2013.01); *B60L 3/0023* (2013.01); *B60L 3/0046* (2013.01);
(Continued)

(58) Field of Classification Search
CPC ...... B60L 3/0092; B60L 58/18; B60L 3/0046; B60L 3/0069; B60L 3/04; Y02T 10/72;
(Continued)

(56) References Cited

U.S. PATENT DOCUMENTS

| | | | | |
|---|---|---|---|---|
| 10,804,815 | B1* | 10/2020 | Chen | B60L 50/14 |
| 2008/0006491 | A1* | 1/2008 | Degoul | H02J 1/08 |
| | | | | 188/1.11 E |

(Continued)

FOREIGN PATENT DOCUMENTS

| | | | | |
|---|---|---|---|---|
| DE | 102019201068 | A1 * | 8/2019 | ............... B60L 1/00 |
| WO | PCT/US95/06975 | A1 | 12/1995 | |

OTHER PUBLICATIONS

European Patent Office, Extended European search report for EP 22158081.4, dated Jul. 25, 2022.

*Primary Examiner* — Ryan Johnson
(74) *Attorney, Agent, or Firm* — Paul Liu; Glenn Theodore Mathews; Perkins Coie, LLP

(57) ABSTRACT

Devices, systems, and methods for constant and reliable power distribution, using a redundant power bridge battery architecture, in autonomous vehicles are described. An example method includes determining that each of a plurality of sensors is operating within in a nominal range for the respective sensor, and distributing, based on the determining, power from at least one alternating current (AC) power source or at least one direct current (DC) power source to at least one power distribution unit (PDU), wherein a first power bridge is coupled to the at least one AC power source and the at least one DC power source and a second power bridge is coupled to the at least one DC power source and the at least one PDU, and wherein the plurality of sensors is used to monitor a health of the vehicle and any single point failure is detectable.

17 Claims, 8 Drawing Sheets

(51) Int. Cl.
*H02J 4/00* (2006.01)
*H04L 12/40* (2006.01)
*B60L 3/00* (2019.01)
*B60L 58/18* (2019.01)
*B60R 16/033* (2006.01)
*H02J 7/14* (2006.01)
*G05D 1/00* (2006.01)

(52) U.S. Cl.
CPC .......... *B60L 3/0069* (2013.01); *B60L 3/0092* (2013.01); *B60L 58/18* (2019.02); *B60R 16/0232* (2013.01); *B60R 16/033* (2013.01); *G01R 31/006* (2013.01); *G05D 1/0055* (2013.01); *H02J 4/00* (2013.01); *H02J 7/1423* (2013.01); *H04L 12/40013* (2013.01); *H02J 2310/46* (2020.01); *H02J 2310/48* (2020.01); *H04L 2012/40215* (2013.01); *H04L 2012/40273* (2013.01); *Y02T 10/72* (2013.01)

(58) Field of Classification Search
CPC ... Y02T 10/7072; B60R 16/03; B60R 16/033; B60R 16/0238; H02J 2310/46; H02J 7/1423; H02J 2310/44; H02J 2310/42; H02J 2310/40; H02J 2310/48; G05D 1/00; G05D 1/0055

See application file for complete search history.

(56) References Cited

U.S. PATENT DOCUMENTS

| | | |
|---|---|---|
| 2017/0166173 A1 | 6/2017 | Lauffer et al. |
| 2018/0029474 A1* | 2/2018 | Berels .................. B60L 3/003 |
| 2018/0229609 A1 | 8/2018 | Hudson et al. |
| 2019/0296546 A1* | 9/2019 | Smith ..................... B60R 16/03 |
| 2020/0017115 A1* | 1/2020 | Higashitani .......... G05D 1/0088 |
| 2020/0125858 A1 | 4/2020 | Bauer et al. |
| 2020/0216002 A1* | 7/2020 | Mazaki .................. H02H 3/08 |
| 2021/0009007 A1 | 1/2021 | Day et al. |
| 2021/0011088 A1* | 1/2021 | Morimoto ................ B60L 3/04 |

* cited by examiner

REDUNDANT POWER BRIDGE BATTERY ARCHITECTURE

TECHNICAL FIELD

This document generally relates to controlling vehicles, and in particular, maintaining reliable power distribution for semi-autonomous and autonomous vehicles.

BACKGROUND

Autonomous vehicle navigation is a technology for sensing the position and movement of a vehicle and, based on the sensing, autonomously control the vehicle to navigate towards a destination. Autonomous vehicles have important applications in transportation of people, goods and services. Ensuring constant and reliable power distribution during operation of the vehicle is paramount for the safety of the vehicle and its passengers, as well as people and property in the vicinity of the vehicle.

SUMMARY

Disclosed are devices, systems and methods for constant and reliable power distribution in autonomous vehicles are described. In an example, this is achieved by using a power bridge and a redundant power bridge, both with intelligent control switches that monitor the health of the vehicle and/or system, and are configured to overcome a single point failure, thereby resulting in the system being Automotive Safety Integrity Level D (ASIL D) compliant.

In an aspect, the disclosed technology can be used to provide a method for power distribution in a vehicle. This method includes determining that each of a plurality of sensors is operating within in a nominal range for the respective sensor, and distributing, based on the determining, power from at least one alternating current (AC) power source or at least one direct current (DC) power source to at least one power distribution unit, wherein a first power bridge is coupled to the at least one AC power source and the at least one DC power source and a second power bridge is coupled to the at least one DC power source and the at least one power distribution unit, wherein a controller switch in a controller area network (CAN) bus of the first power bridge comprises a switch and the plurality of sensors, and wherein (a) the plurality of sensors is used to monitor a health of the vehicle and (b) a single point failure is detectable using the first power bridge and the second power bridge.

In another aspect, the disclosed technology can be used to provide a system for power distribution in a vehicle. This system includes at least one alternating current (AC) power source, at least one direct current (DC) power source, a first power bridge coupled to the at least one AC power source and the at least one DC power source, at least one power distribution unit, and a second power bridge coupled to the at least one battery array and the at least one power distribution unit, wherein a controller switch in the first power bridge comprises a plurality of sensors, and wherein (a) the plurality of sensors is used to monitor a health of the system and (b) a single point failure is detected using the first power bridge and the second power bridge.

In yet another aspect, the disclosed technology can be used to provide a system for power distribution in a vehicle. This system includes a power bridge comprising a plurality of sensors that is used to (a) monitor a health of the system and (b) detect a single point of failure in the power distribution, an alternator that is a first distance from the power bridge and is coupled thereto, a shore power unit that is a second distance from the power bridge and is coupled thereto, wherein the second distance is less than the first distance, a first battery that is a third distance from the power bridge and is coupled thereto, wherein the third distance is less than the second distance, and a second battery that is a fourth distance away from the power bridge and is coupled thereto, wherein the fourth distance is less than the third distance, and wherein the power bridge is configured to monitor the health of the system and detect a single point of failure in the power distribution.

In another aspect, the above-described method is embodied in the form of processor-executable code and stored in a computer-readable program medium.

In yet another aspect, a device that is configured or operable to perform the above-described method is disclosed. The device may include a processor that is programmed to implement this method.

The above and other aspects and features of the disclosed technology are described in greater detail in the drawings, the description and the claims.

DETAILED DESCRIPTION

The transportation industry has been undergoing considerable changes in the way technology is used to control the operation of vehicles. As exemplified in the automotive passenger vehicle, there has been a general advancement towards shifting more of the operational and navigational decision making away from the human driver and into on-board computing power. This is exemplified in the extreme by the numerous under-development autonomous vehicles. Current implementations are in intermediate stages, such as the partially-autonomous operation in some vehicles (e.g., autonomous acceleration and navigation, but with the requirement of a present and attentive driver), the safety-protecting operation of some vehicles (e.g., maintaining a safe following distance and automatic braking), the safety-protecting warnings of some vehicles (e.g., blind-spot indicators in side-view mirrors and proximity sensors), as well as ease-of-use operations (e.g., autonomous parallel parking).

Any level of autonomous navigation relies on a consistent and reliable power supply, and that power supply needs to be resilient against safety critical faults in order to ensure proper operation of the vehicle. Autonomous vehicles, including partially autonomous vehicles, have significantly higher electrical loads than non-autonomous vehicles since autonomous and partially autonomous vehicles rely on more sensors and computing devices than their non-autonomous counterparts. Autonomous vehicles rely on power supplies to power those additional sensors and computing devices. The described power supply architectures maintain a stable power source, continuously monitor the health of the vehicle, and are configured to overcome a single point failure, which results in the power supply architectures meeting the Automotive Safety Integrity Level D (ASIL D) requirements.

In contrast, existing systems do not implement the redundant hardware necessary to meet ASIL D requirements because they require continuous human supervision and intermittent human intervention. Redundant power bridges with intelligent control switches are typically not implemented in existing systems.

Figure 1:
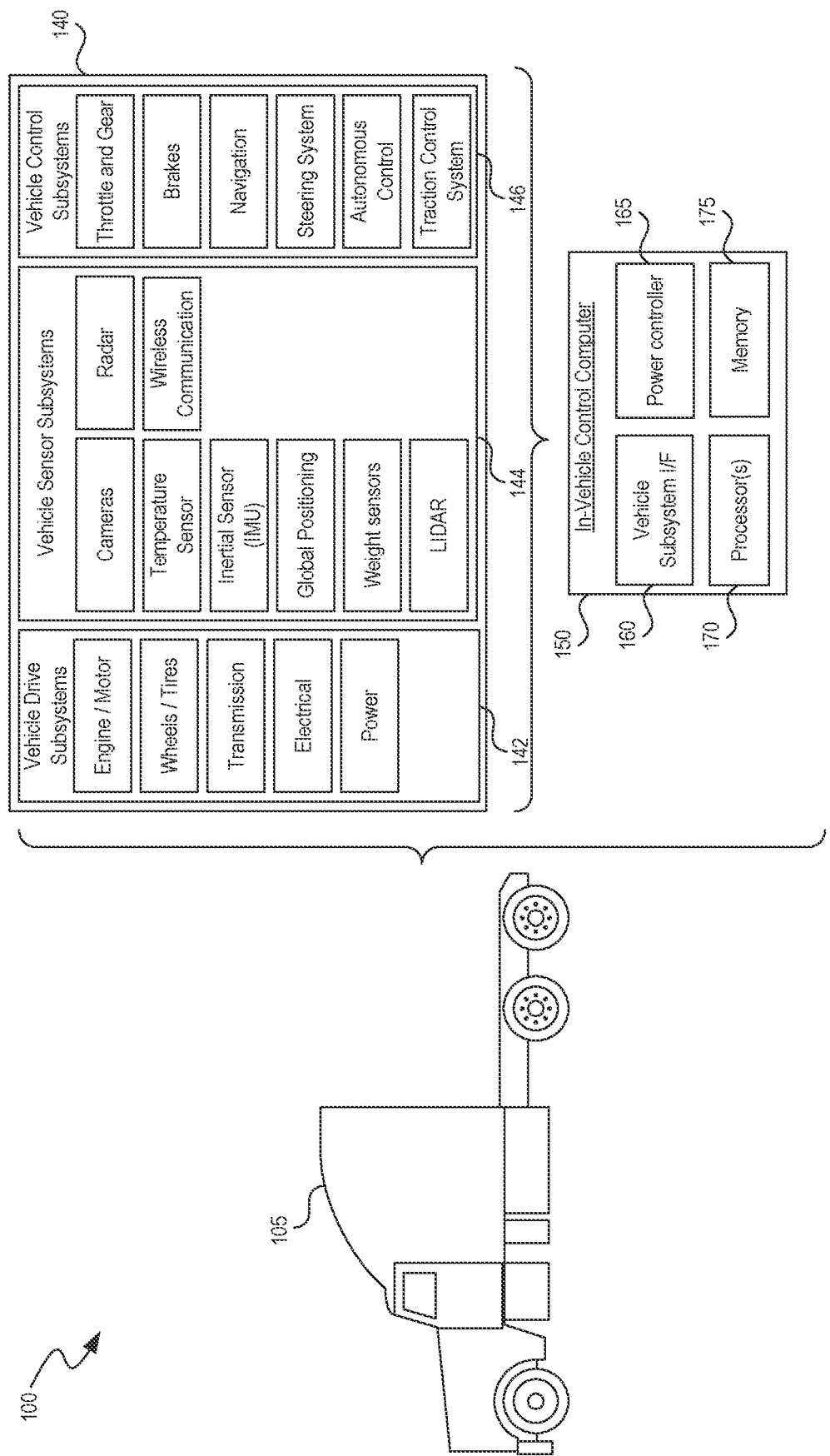
FIG. 1 shows a block diagram of an example vehicle ecosystem in which an in-vehicle control computer located in the vehicle comprises a power controller that can configure and control a power distribution architecture.

FIG. 1 shows a block diagram of an example vehicle ecosystem 100 in which an in-vehicle control computer 150 is located in the autonomous vehicle 105 includes a synchronization unit that synchronizes multiple heterogeneous sensors. As shown in FIG. 1, the autonomous vehicle 105 may be a semi-trailer truck. The vehicle ecosystem 100 includes several systems and components that can generate and/or deliver one or more sources of information/data and related services to the in-vehicle control computer 150 that may be located in an autonomous vehicle 105. The in-vehicle control computer 150 can be in data communication with a plurality of vehicle subsystems 140, all of which can be resident in the autonomous vehicle 105. The in-vehicle computer 150 and the plurality of vehicle subsystems 140 can be referred to as autonomous driving system (ADS). A vehicle subsystem interface 160 is provided to facilitate data communication between the in-vehicle control computer 150 and the plurality of vehicle subsystems 140. In some embodiments, the vehicle subsystem interface 160 can include a controller area network controller to communicate with devices in the vehicle subsystems 140.

The autonomous vehicle 105 may include various vehicle subsystems that support of the operation of autonomous vehicle 105. The vehicle subsystems may include a vehicle drive subsystem 142, a vehicle sensor subsystem 144, and/or a vehicle control subsystem 146. The components or devices of the vehicle drive subsystem 142, the vehicle sensor subsystem 144, and the vehicle control subsystem 146 as shown as examples. In some embodiment, additional components or devices can be added to the various subsystems or one or more components or devices can be removed. The vehicle drive subsystem 142 may include components operable to provide powered motion for the autonomous vehicle 105. In an example embodiment, the vehicle drive subsystem 142 may include an engine or motor, wheels/tires, a transmission, an electrical subsystem, and a power source.

The vehicle sensor subsystem 144 may include a number of sensors configured to sense information about an environment in which the autonomous vehicle 105 is operating or a condition of the autonomous vehicle 105. The vehicle sensor subsystem 144 may include one or more cameras or image capture devices, one or more temperature sensors, an inertial measurement unit (IMU), a Global Positioning System (GPS) device, a laser range finder/LiDAR unit, a RADAR unit, and/or a wireless communication unit (e.g., a cellular communication transceiver). The vehicle sensor subsystem 144 may also include sensors configured to monitor internal systems of the autonomous vehicle 105 (e.g., an O2 monitor, a fuel gauge, an engine oil temperature, etc.). In some embodiments, the vehicle sensor subsystem 144 may include sensors in addition to the sensors shown in FIG. 1.

The IMU may include any combination of sensors (e.g., accelerometers and gyroscopes) configured to sense position and orientation changes of the autonomous vehicle 105 based on inertial acceleration. The GPS device may be any sensor configured to estimate a geographic location of the autonomous vehicle 105. For this purpose, the GPS device may include a receiver/transmitter operable to provide information regarding the position of the autonomous vehicle 105 with respect to the Earth. The RADAR unit may represent a system that utilizes radio signals to sense objects within the environment in which the autonomous vehicle 105 is operating. In some embodiments, in addition to sensing the objects, the RADAR unit may additionally be configured to sense the speed and the heading of the objects proximate to the autonomous vehicle 105. The laser range finder or LiDAR unit may be any sensor configured to sense objects in the environment in which the autonomous vehicle 105 is located using lasers. The LiDAR unit may be a spinning LiDAR unit or a solid-state LiDAR unit. The cameras may include one or more cameras configured to capture a plurality of images of the environment of the autonomous vehicle 105. The cameras may be still image cameras or motion video cameras.

The vehicle control subsystem 146 may be configured to control operation of the autonomous vehicle 105 and its components. Accordingly, the vehicle control subsystem 146 may include various elements such as a throttle and gear, a brake unit, a navigation unit, a steering system and/or an autonomous control unit. The throttle may be configured to control, for instance, the operating speed of the engine and, in turn, control the speed of the autonomous vehicle 105. The gear may be configured to control the gear selection of the transmission. The brake unit can include any combination of mechanisms configured to decelerate the autonomous vehicle 105. The brake unit can use friction to slow the wheels in a standard manner. The brake unit may include an Anti-lock brake system (ABS) that can prevent the brakes from locking up when the brakes are applied. The navigation unit may be any system configured to determine a driving path or route for the autonomous vehicle 105. The navigation unit may additionally be configured to update the driving path dynamically while the autonomous vehicle 105 is in operation. In some embodiments, the navigation unit may be configured to incorporate data from the GPS device and one or more predetermined maps so as to determine the driving path for the autonomous vehicle 105. The steering system may represent any combination of mechanisms that may be operable to adjust the heading of autonomous vehicle 105 in an autonomous mode or in a driver-controlled mode.

The autonomous control unit may represent a control system configured to identify, evaluate, and avoid or otherwise negotiate potential obstacles in the environment of the autonomous vehicle 105. In general, the autonomous control unit may be configured to control the autonomous vehicle 105 for operation without a driver or to provide driver assistance in controlling the autonomous vehicle 105. In some embodiments, the autonomous control unit may be configured to incorporate data from the GPS device, the RADAR, the LiDAR, the cameras, and/or other vehicle subsystems to determine the driving path or trajectory for the autonomous vehicle 105.

The traction control system (TCS) may represent a control system configured to prevent the autonomous vehicle 105 from swerving or losing control while on the road. For example, TCS may obtain signals from the IMU and the engine torque value to determine whether it should intervene and send instruction to one or more brakes on the autonomous vehicle 105 to mitigate the autonomous vehicle 105 swerving. TCS is an active vehicle safety feature designed to help vehicles make effective use of traction available on the road, for example, when accelerating on low-friction road surfaces. When a vehicle without TCS attempts to accelerate on a slippery surface like ice, snow, or loose gravel, the wheels can slip and can cause a dangerous driving situation. TCS may also be referred to as electronic stability control (ESC) system.

Many or all of the functions of the autonomous vehicle 105 can be controlled by the in-vehicle control computer 150. The in-vehicle control computer 150 may include at least one processor 170 (which can include at least one microprocessor) that executes processing instructions stored in a non-transitory computer readable medium, such as the memory 175. The in-vehicle control computer 150 may also represent a plurality of computing devices that may serve to control individual components or subsystems of the autonomous vehicle 105 in a distributed fashion. In some embodiments, the memory 175 may contain processing instructions (e.g., program logic) executable by the processor 170 to perform various methods and/or functions of the autonomous vehicle 105, including those described for the power controller 165 as explained in this patent document. For instance, the processor 170 executes the operations associated with power controller 165 for ensuring constant and reliable power distribution using intelligent controller switches in a power bridge and redundant power bridge. The operations of the power control 165, the power bridge, and the redundant power bridge are further described in this patent document.

The memory 175 may contain additional instructions as well, including instructions to transmit data to, receive data from, interact with, or control one or more of the vehicle drive subsystem 142, the vehicle sensor subsystem 144, and the vehicle control subsystem 146. The in-vehicle control computer 150 may control the function of the autonomous vehicle 105 based on inputs received from various vehicle subsystems (e.g., the vehicle drive subsystem 142, the vehicle sensor subsystem 144, and the vehicle control subsystem 146).

Figure 2:
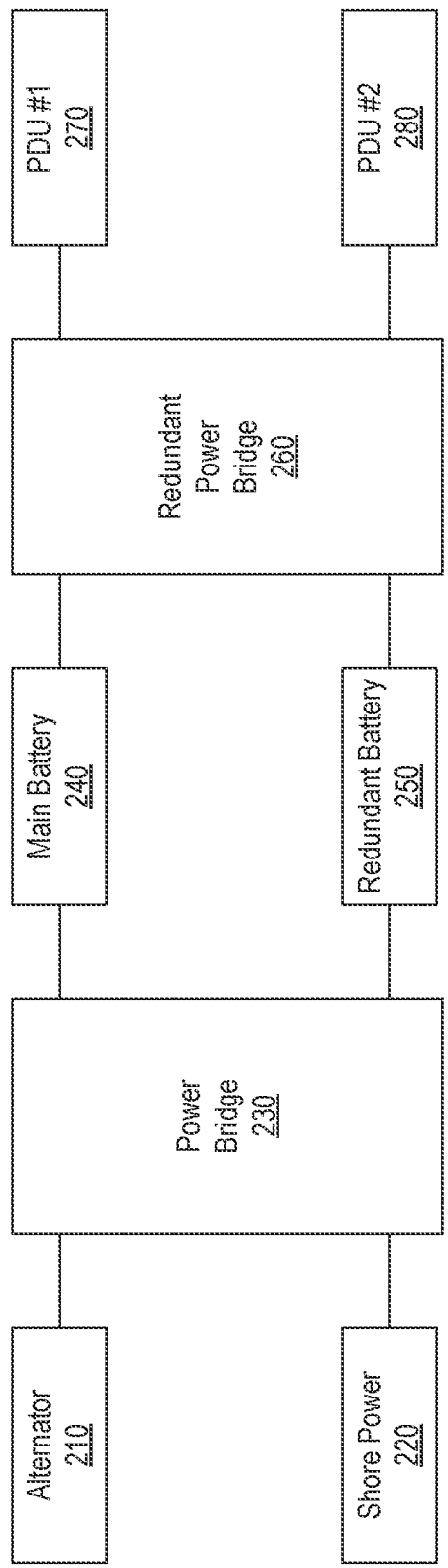
FIG. 2 shows an example architecture for redundant power distribution in a vehicle.

FIG. 2 shows an example architecture for redundant power distribution. As shown therein, a power bridge 230 couples an alternator 210 and a shore power module 220 (or more generally, an alternating current (AC) source) to a main battery 240 and a redundant battery 250 (or more generally, a direct current (DC) source), and a redundant power bridge 260 coupled the main battery 240 and the redundant battery 250 to a first power distribution unit 270 and a second power distribution unit 280 (denoted PDU #1 and PDU #2 in FIG. 2, respectively).

In some embodiments, the alternator 210 is the primary power source for the vehicle, with the shore power module 220 typically being used to provide power to the system (e.g., for charging) when the vehicle is parked. The main battery array 240 and redundant battery array 250 remain charged and are used in the event that the alternator 210 and/or the shore power module 220 cannot supply the required power. The AC power sources and DC power sources supply power to the power distribution units 270 and 280, which are configured to distribute the power to the various subsystems and components in the vehicle. In some embodiments, the power distribution units 270 and 280 can be configured to provide different levels of power.

The power bridge between an AC power source and a series of battery arrays, as well as a redundant power bridge between the battery arrays and separate power distribution units, advantageously ensure that stable power can be maintained even in the event of a single point failure, e.g., a cable that is cut, a battery that short circuits, a component that short circuits, an alternator that stops operating, and the like. In some embodiments, the redundant power bridge can be configured to include more features than the power bridge, e.g., the ability to sense the status of the main and redundant battery arrays.

In some embodiments, the components used to monitor the health of the vehicle and detect any single point failure are 20 feet from the alternator, 12 feet from the main battery array, 6 feet from the redundant battery array, and 15 feet from the shore power.

Figure 3:
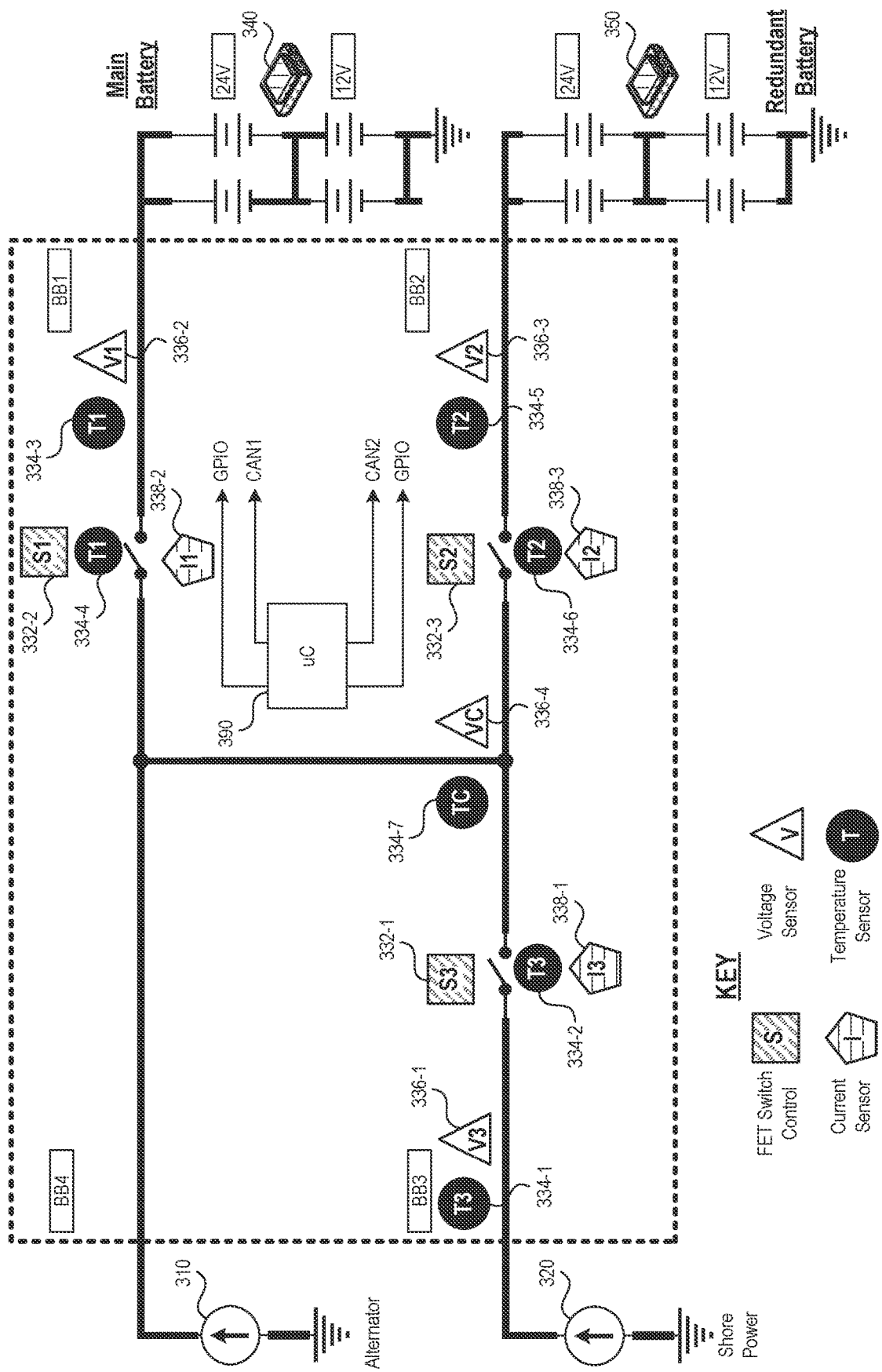
FIG. 3 shows an example architecture of a power bridge.

FIG. 3 shows an example architecture of a power bridge. As shown therein, the power bridge couples the alternator 310 (at a first terminal) and the shore power module 320 (at a second terminal) to a main battery array 340 (at a third terminal) and a redundant battery array 350 (at a fourth terminal) and includes controller area network (CAN) buses that include intelligent controller switches. The power bridge includes three intelligent controller switches that are positioned between the upper junction and the third terminal (S1), the fourth terminal and the lower junction (S2), and the lower junction and the second terminal (S3).

In some embodiments, an intelligent controller switch includes a switch control, a current sensor, a voltage sensor, and a temperature sensor. In an example, as shown in FIG. 3, the intelligent controller switch between the upper junction and the third terminal includes the switch control 332-2, a current sensor 338-2, a voltage sensor 336-2, and temperature sensors 334-3 and 334-4. Herein, temperature sensor 334-3 is on the CAN bus bar and temperature sensor 334-4 is on the switch. The intelligent controller switch between the second terminal and the lower junction includes the switch control 332-1, a current sensor 338-1, a voltage sensor 336-1, and temperature sensors 334-1 and 334-2, which are positioned on the CAN bus bar and the switch, respectively. The intelligent controller switch between the lower junction and the fourth terminal includes the switch control 332-3, a current sensor 338-3, a voltage sensor 336-3, and temperature sensors 334-5 and 334-6, which are positioned on the CAN bus bar and the switch, respectively. Furthermore, an additional temperature sensor 334-7 and an additional voltage sensor 336-4 are included at the lower junction to ensure improve detectability of any failures in the power supply. In an example, the switch may be a field-effect transistor (FET) switch.

Continuing with the description of FIG. 3, a microcontroller 390, which is connected to CAN buses (e.g., CAN1 and CAN2) and general purpose input/output (GPIO) ports, can be configured to monitor the health of the system and detect any single point failure using the power bridge and the redundant power bridge, which results in the system being Automotive Safety Integrity Level D (ASIL D) compliant. In addition, compliance with ASIL D is ensured by derating the components of the power bridge and redundant power bridge and designing the hardware and software to meet the necessary industry certifications. In an example, the derating operation includes operating the components at 50% of their rated maximum capabilities.

In some embodiments, the main battery array 340 and the redundant battery array can be configured to provide different power levels (e.g., 12V or 24V). In other embodiments, the switches in the intelligent switch controllers can handle currents in the range of hundreds of amperes (e.g., 400 A). For example, an FET switch can be configured to handle a 400 A current.

In some embodiments, monitoring the health of the system and detecting any single point failure is performed using the sensors in the intelligent switch controllers. For example, each of the sensors have a nominal operating range, and the system is deemed to be operating normally as long as all sensor outputs are within the nominal operating ranges. However, as soon as there is a deviation from this nominal range, action is taken to minimize hardware damage and ensure a consistent power supply. The deviation from the nominal range may be an over-current, an increase in temperature, a sustained voltage spike, and the like.

Figure 4:
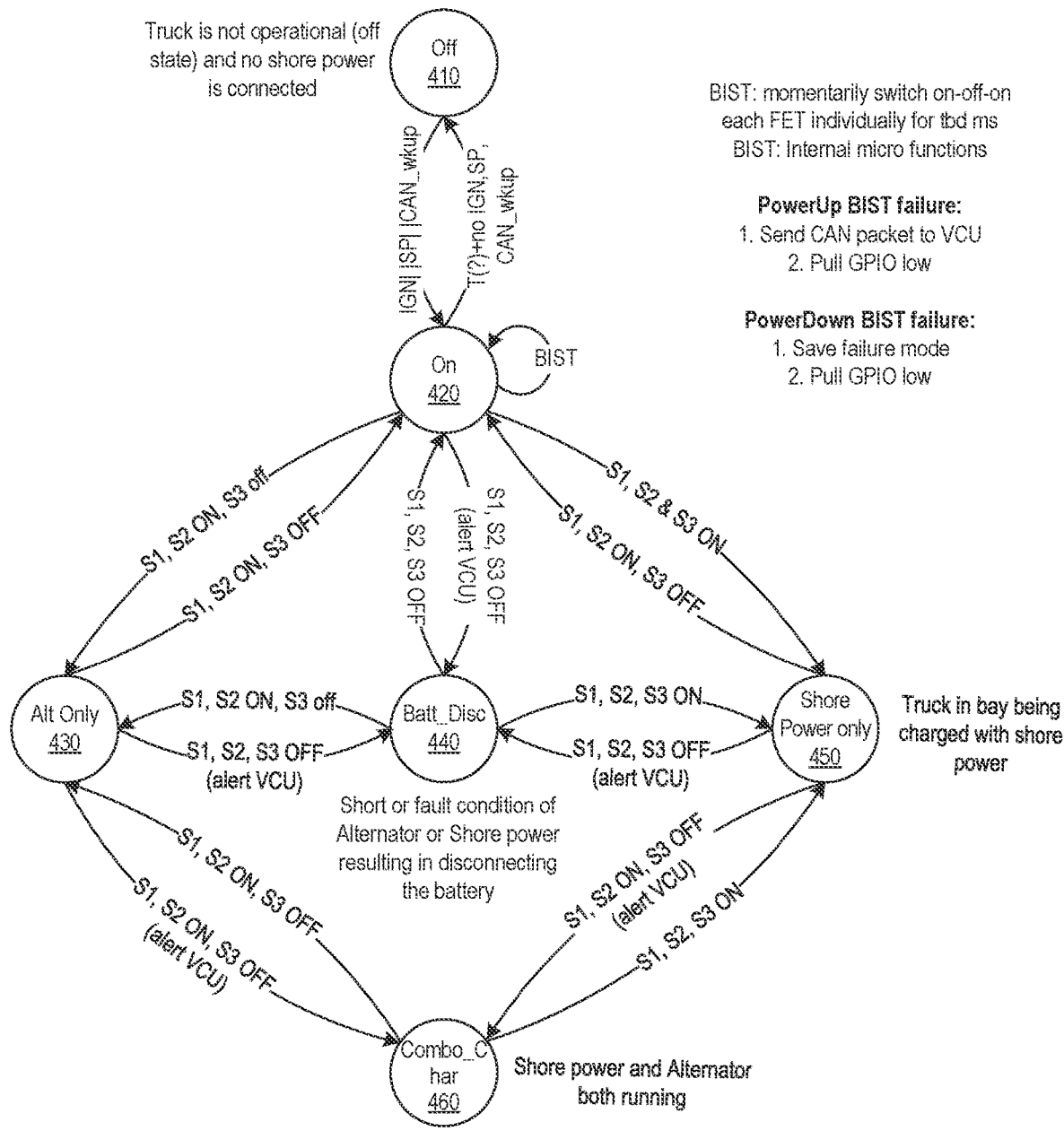
FIG. 4 shows an example of a finite state machine (FSM) that controls operation of the power bridge shown in FIG. 3.

FIG. 4 shows an example of a finite state machine (FSM) that controls operation of the power bridge shown in FIG. 3. As shown therein, the states of the FSM include an "Off" state (410, also referred to as "Sleep" mode) that corresponds to the vehicle being inoperative and with no shore power connected, an "On" state (420, also referred to as "Power Up" mode or a "Power None" mode, based on the previous state of the vehicle), an "Alt Only" state (430, also referred to as "Power Manual" mode) and a "Shore Power Only" state (450, also referred to as "Power Charge" mode) that correspond to the vehicle operating using only the alternator (e.g., 310 in FIG. 3) or only the shore power (e.g., 320 in FIG. 3) as its power source, respectively, a "Combo_Char" state (460) in which both the alternator and shore power are running, and a "Batt_Disc" (440, also referred to as "Power Error" mode) state that corresponds to a short or fault condition of the shore power or the alternator resulting in the battery (e.g., main battery 330 or redundant battery 340) being disconnected. The state of the vehicle, and the transition from one state to another state is based on whether one or more of the three switches (e.g., S1, S2 and S3) are connected or not, a previous state of the vehicle, and other operational conditions and/or signals associated with the vehicle.

In some embodiments, and as shown in FIG. 4, the following state transitions are supported by the power bridge:

Sleep mode (410) to Power On mode (420) on ignition, shore power being connected, or a wake-up signal on a CAN bus;

Remain in the Power On mode (420) each time a built-in self-test (BIST) is performed, where a BIST includes momentarily switching each switch on-off-on individually for a predetermined amount of time;

Power On mode (420) to Power Charge mode (450) when all three switches (S1, S2 and S3) are connected;

Power On mode (420) to Power Manual mode (430) when two switches are connected, e.g., S1 and S2 are on, and S3 is off;

Any mode to Power Error mode (440) when all three switches (S1, S2 and S3) are disconnected and an alert message is sent to the vehicle control unit (VCU). The Power Error mode is entered when any error condition (e.g., any sensor operating outside is nominal operating range) is identified and the VCU is alerted;

Any mode to the Power None mode (420) when all three switches (S1, S2 and S3) are disconnected, but no message is sent to the VCU; and Power None mode (420) to Sleep mode (410) after a predetermined time has elapsed and no ignition message, shore power activation message, or CAN wake-up signal is received, and the vehicle is inoperative.

In some embodiments, a PowerUp BIST failure results in sending a CAN packet to the VCU and pulling the GPIO pin to a low state, and a PowerDown BIST failure results in saving the failure mode and pulling the GPIO pin to a low state.

In some embodiments, a CAN bus message can be transmitted in each of the above modes to reflect the status of the mode.

Figure 5:
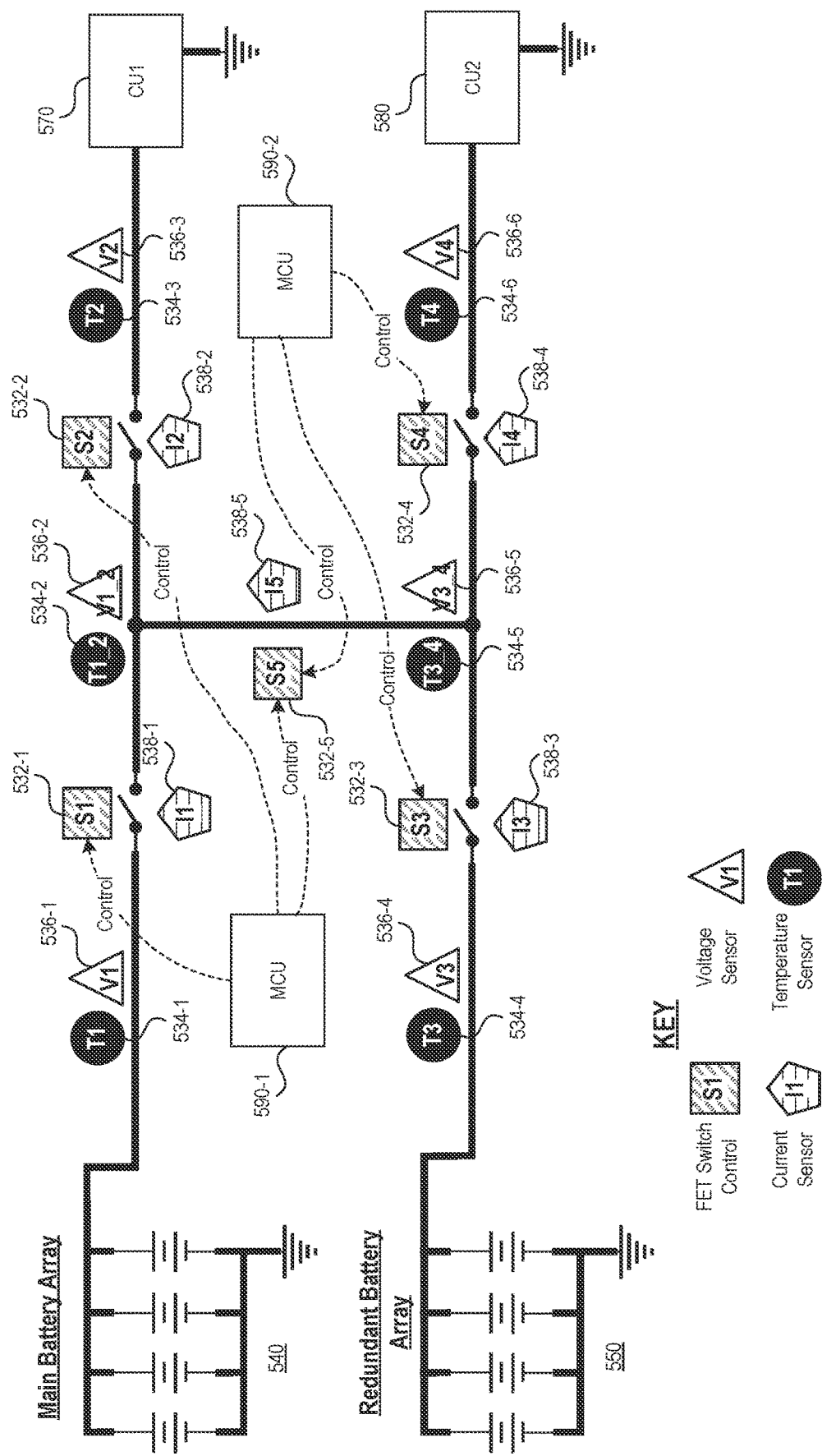
FIG. 5 shows an example architecture of a redundant power bridge.

FIG. 5 shows an example architecture of a redundant power bridge. This example includes some features or components that are similar to those shown in FIG. 3 and described above. At least some of these features or components may not be separately described in the context of this example. As shown in FIG. 5, the redundant power bridge couples the main battery array 540 (at a first terminal) and a redundant battery array 550 (at a second terminal) to a first computational unit 570 (at a third terminal) and a second computational unit 580 (at a fourth terminal) and includes controller area network (CAN) buses that include intelligent controller switches. The redundant power bridge includes five switches that are positioned between the first terminal and an upper junction (S1), the upper junction and the third terminal (S2), the second terminal and a lower junction (S3), the lower junction and the fourth terminal (S4), and the lower junction and the upper junction (S5). Switches S1, S2, S3, and S4 are referred to as terminal switches, and S5 is referred to as a crossover switch.

Each of the first, second, third, and fourth switches includes an intelligent controller switch that comprises a switch control, a current sensor, a voltage sensor, and a temperature sensor. For example, the first switch (between the first terminal and the upper junction) includes a switch control 532-1, a temperature sensor 534-1, a voltage sensor 536-1, and a current sensor 538-1. The fifth switch (between the upper and lower junctions) includes a switch control 532-5 and a current sensor 538-5, and additional temperature and voltage sensors are deployed at the upper junction and the lower junction. This sensor configuration advantageously enables any single point failure to be rapidly detected so preventative measures can be taken.

In some embodiments, and as shown in FIG. 5, switch controls (532-1 through 532-5) are controlled by a first main control unit (MCU) 590-1 and a second MCU 590-2. In an example, the redundant power bridge ensures that if the shore power connector or cable touches the frame of the vehicle (which is grounded), the entire system does not short circuit. In another example, the proper functioning of the AC and DC power sources are monitored to ensure that there is sufficient, but not too much, power being supplied to the components of the vehicle. That is, maintaining consistent power and preventing catastrophic failure are, in part, some of the key objectives of the described embodiments.

Figure 6:
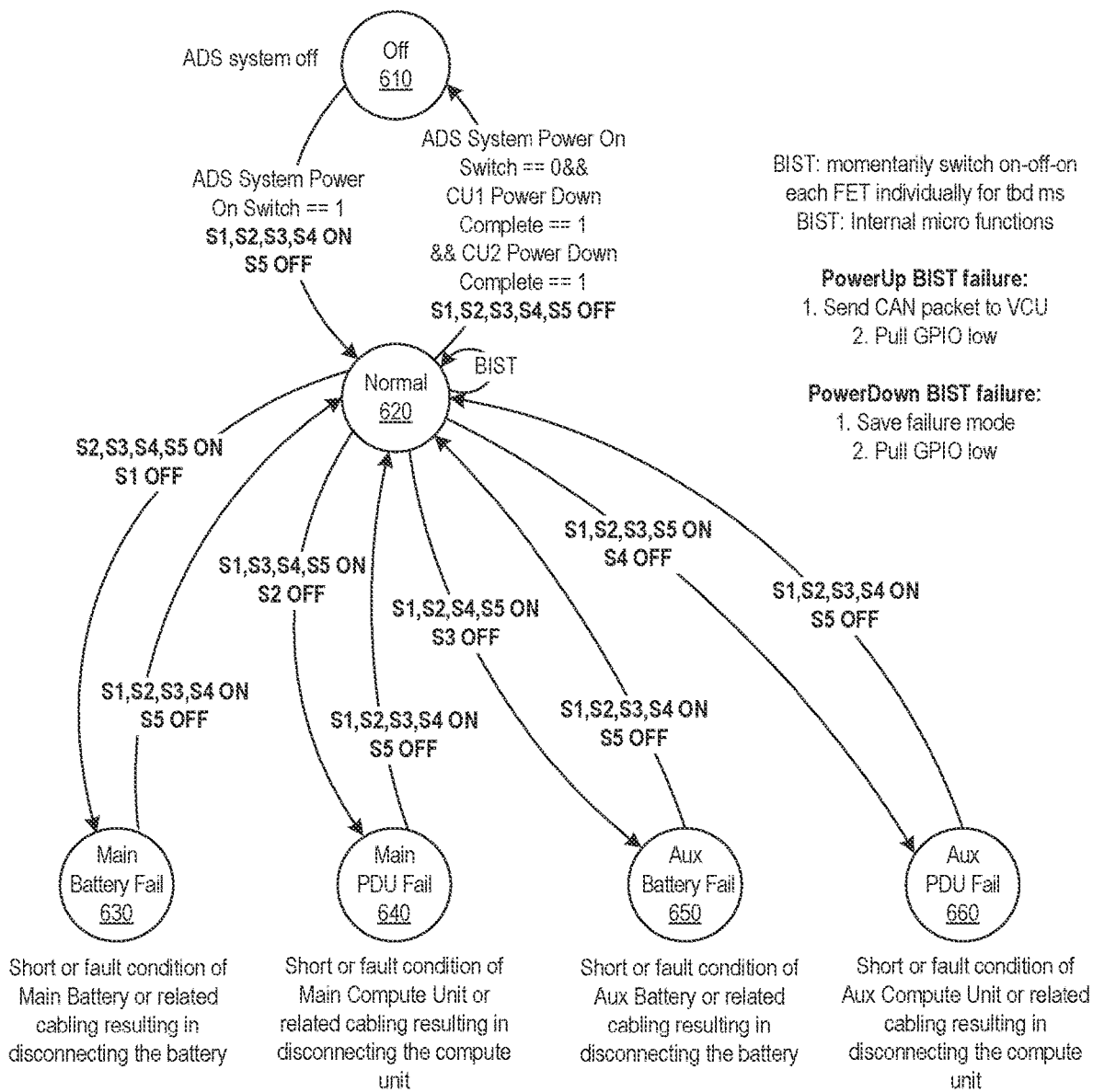
FIG. 6 shows an example of an FSM for the redundant power bridge shown in FIG. 5.

FIG. 6 shows an example of a finite state machine (FSM) for the redundant power bridge shown in FIG. 5. As shown therein, the states of the FSM include an "Off" state (610), a "Normal" operating state (620), a "Main Battery Fail" state (630), a "Main PDU Fail" state (640), an "AUX Battery Fail" state (650), and an "AUX PDU Fail" state (660), wherein each "Fail" state corresponds to a fault or a short circuit condition in the respective component or related cabling resulting in disconnecting that component.

In some embodiments, and as shown in FIG. 6, the following state transitions are supported by the redundant power bridge:

Off state (610) to Normal operating state (620) when the four terminal switches (S1, S2, S3 and S4) are on and the crossover switch (S5) is off, and the ADS System Power On Switch flag is true;

Remain in the Normal operating state (620) each time a built-in self-test (BIST) is performed, where a BIST includes momentarily switching each switch on-off-on individually for a predetermined amount of time;

Normal operating state (620) to any "Fail" state (630, 640, 650 or 660) when the corresponding terminal switch (S1, S2, S3 or S4, respectively) is off and the remaining switches are on, which corresponds to:

Normal operating state (620) to Main Battery Fail state (630) when S2, S3, S4 and S5 are on, and S1 is off;

Normal operating state (620) to Main PDU Fail state (640) when S1, S3, S4 and S5 are on, and S2 is off;

Normal operating state (620) to AUX Battery Fail state (650) when S1, S2, S4 and S5 are on, and S3 is off; and Normal operating state (620) to AUX PDU Fail state (660) when S1, S2, S3 and S5 are on, and S4 is off;

Any "Fail" state (630, 640, 650 or 660) to Normal operating state (620) when the four terminal switches (S1, S2, S3 and S4) are on and the crossover switch (S5) is off; and Normal operating state (620) to Off state (610) when all switches are off, the ADS System Power On Switch flag is false, the CU1 Power Down Complete flag is true, and the CU2 Power Down Complete flag is true, i.e., the computational units have powered down.

In some embodiments, the redundant power bridge can transition between the following operation modes: Sleep, Power Up, Normal Operation, Watchdog (Error), Terminal Error and Power Down. The following state transitions and operating mode characteristics are supported by the redundant power bridge:

Sleep mode is a low power consumption mode, and corresponds to all five switches (S1, S2, S3, S4 and S5) being off;

Sleep mode to Power Up mode when activity is seen on one of two wake-up signals or when traffic is sensed on one of four CAN buses;

Power Up mode to Normal operation mode when all sensors are operating within their nominal ranges, the terminal switches (S1, S2, S3 and S4) are on, and the crossover switch (S5) is off;

Power Up mode to Watchdog mode that occurs concurrently with transitioning to Normal operation mode. That is, the Watchdog mode runs continually and monitors the system for the presence of an error, and the detection of any error will transition operation to Watchdog Error mode;

Any mode to Terminal Error mode when the output of any sensor deviates from the nominal operating range of that sensor, and the corresponding terminal switch is off and all other switches (including the crossover switch) is on; and Any mode to Sleep mode when the wake-up signals de-assert, all CAN bus traffic ceases, and a predetermined duration of time has elapsed.

In some embodiments, the redundant power bridge can transmit a CAN bus message that reflects the status of the mode that it is currently operating in.

In some embodiments, the MCU software can be configured to handle transients in the current and voltage signals. A temporary spike in voltage or current, which is not indicative of a systemic problem and corresponds to a false alarm, is detected but a terminal error is not declared, and operation continues in the Normal and/or Watchdog modes.

Figure 7:
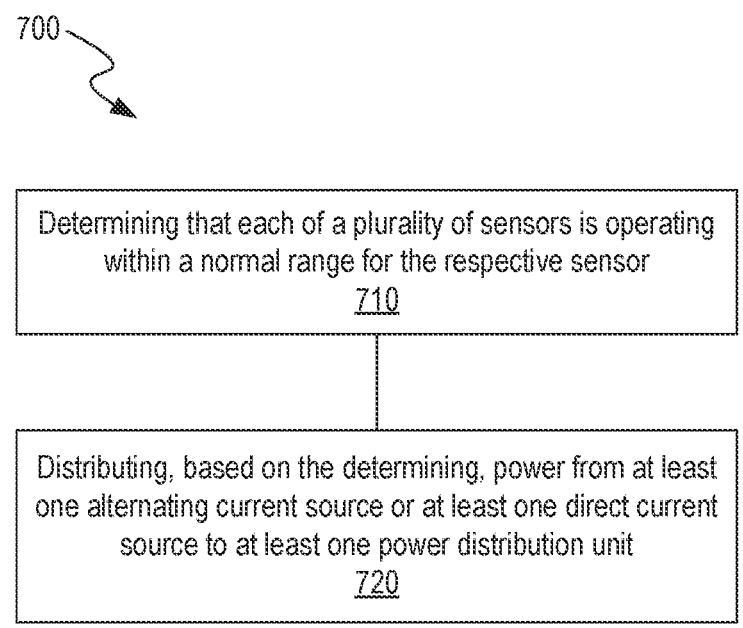
FIG. 7 shows a flowchart of an example method for synchronization in a vehicle.

FIG. 7 shows a flowchart for an example method 700 for power distribution in a vehicle. The method 700 includes, at operation 710, determining that each of a plurality of sensors is operating within in a nominal range for the respective sensor.

The method 700 includes, at operation 720, distributing, based on the determining, power from at least one alternating current (AC) power source or at least one direct current (DC) power source to at least one power distribution unit. In some embodiments, a first power bridge is coupled to the at least one AC power source and the at least one DC power source and a second power bridge is coupled to the at least one DC power source and the at least one power distribution unit, a controller switch in a controller area network (CAN) bus of the first power bridge comprises a switch and the plurality of sensors, and (a) the plurality of sensors is used to monitor a health of the vehicle and (b) a single point failure is detectable using the first power bridge and the second power bridge.

In some embodiments, performing operations 710 and 720 results in the system being Automotive Safety Integrity Level D (ASIL D) compliant.

In some embodiments, the plurality of sensors comprises a first temperature sensor that measures a temperature of a CAN bus bar and a second temperature sensor that measures a temperature of the switch.

In some embodiments, the method 700 further includes the operation of derating the switch and each of the plurality of sensors.

In some embodiments, the method 700 further includes the operation of detecting the single point failure upon a determination that at least one sensor of the plurality of sensors is operating outside a nominal range of the respective sensor, wherein the nominal range is based on derating the at least one AC power source or the at least one DC power source.

In some embodiments, a current limit of the switch exceeds 300 amperes.

In some embodiments, a system for power distribution in a vehicle is disclosed. This system includes at least one alternating current (AC) power source, at least one direct current (DC) power source, a first power bridge coupled to the at least one AC power source and the at least one DC power source, at least one power distribution unit, and a second power bridge coupled to the at least one battery array and the at least one power distribution unit, wherein a controller switch in the first power bridge comprises a plurality of sensors, and wherein (a) the plurality of sensors is used to monitor a health of the system and (b) a single point failure is detected using the first power bridge and the second power bridge.

In some embodiments, the at least one power distribution unit is a device fitted with multiple outputs designed to distribute electric power. Monitoring the at least one power distribution unit, using the described embodiments, improves efficiency, uptime, and growth.

In some embodiments, the plurality of sensors comprises a temperature sensor, a voltage sensor, and a current sensor.

In some embodiments, the at least one AC power source comprises an alternator.

In some embodiments, the at least one DC power source comprises a first battery array and a second battery array. In an example, the first battery array is a main battery array and the second battery array is a redundant battery array.

In some embodiments, the second power bridge comprises a first terminal coupled to a first junction via a first controller switch, a second terminal coupled to the first junction via a second controller switch, a third terminal coupled to a second junction via a third controller switch, and a fourth terminal coupled to the second junction via a fourth controller switch, wherein the first terminal and the second terminal are coupled to the at least one AC power source, wherein the third terminal and the fourth terminal are coupled to the at least one DC power source, and wherein the first junction and the second junction are coupled via a fifth controller switch.

In some embodiments, each of the first, second, third, fourth, and fifth controller switches being disconnected corresponds to the system being in a sleep mode.

In some embodiments, each of the first, second, third, and fourth controller switches being connected, the fifth controller switch being disconnected, and each of the plurality of sensors operating in a respective nominal range corresponds to the system being in a normal operating mode.

In some embodiments, the continuously monitoring the health of the system corresponds to the system being in a watchdog mode.

In some embodiments, the watchdog mode is configured to detect the single point failure that includes exactly one of a cable in the system being cut, one of the at least one DC power source short circuiting, one of the at least one AC power source short circuiting, a component in the system short circuiting, and a sensor of the plurality of sensors operating outside the respective nominal range.

In some embodiments, the vehicle is a semi-truck powered by lead-acid batteries operating with a nominal cell voltage of 12V or 24V. In an example, the nominal 12V or 24V cell voltage refers to the voltage of a battery in the middle of its discharge cycle, which is also where the voltage stays for the longest period during the discharge.

In some embodiments, the described configuration and operation of the system results in the system being Automotive Safety Integrity Level D (ASIL D) compliant.

In some embodiments, another system for power distribution in a vehicle is disclosed. This system includes a power bridge comprising a plurality of sensors that is used to (a) monitor a health of the system and (b) detect a single point of failure in the power distribution, an alternator that is a first distance from the power bridge and is coupled thereto, a shore power unit that is a second distance from the power bridge and is coupled thereto, wherein the second distance is less than the first distance, a first battery that is a third distance from the power bridge and is coupled thereto, wherein the third distance is less than the second distance, and a second battery that is a fourth distance away from the power bridge and is coupled thereto, wherein the fourth distance is less than the third distance, and wherein the power bridge is configured to monitor the health of the system and detect a single point of failure in the power distribution.

In some embodiments, the first battery is a main battery and the second battery is a redundant battery or an alternate battery.

In some embodiments, a first controller area network (CAN) bus connecting the shore power unit and a first junction, the first CAN bus comprising a first controller switch that includes the plurality of sensors, a second CAN bus connecting the first battery and a second junction, the second CAN bus comprising a second controller switch, a third CAN bus connecting the first junction and the second battery, the third CAN bus comprising a third controller switch, a fourth CAN bus connecting the alternator and the second junction, and a fifth CAN bus connecting the first junction and the second junction.

In some embodiments, each of the first, second, and third controller switches being disconnected corresponds to the system being in a sleep mode.

In some embodiments, the system transitions from the sleep mode to a mode selected from the group consisting of a power charging mode, a power manual mode, a power error mode, and a no power mode.

In some embodiments, the system is configured to transition to the sleep mode upon a determination that the system has been running in the no power mode for a predetermined duration of time.

In some embodiments, the described configuration and operation of the system results in the system being Automotive Safety Integrity Level D (ASIL D) compliant.

Figure 8:
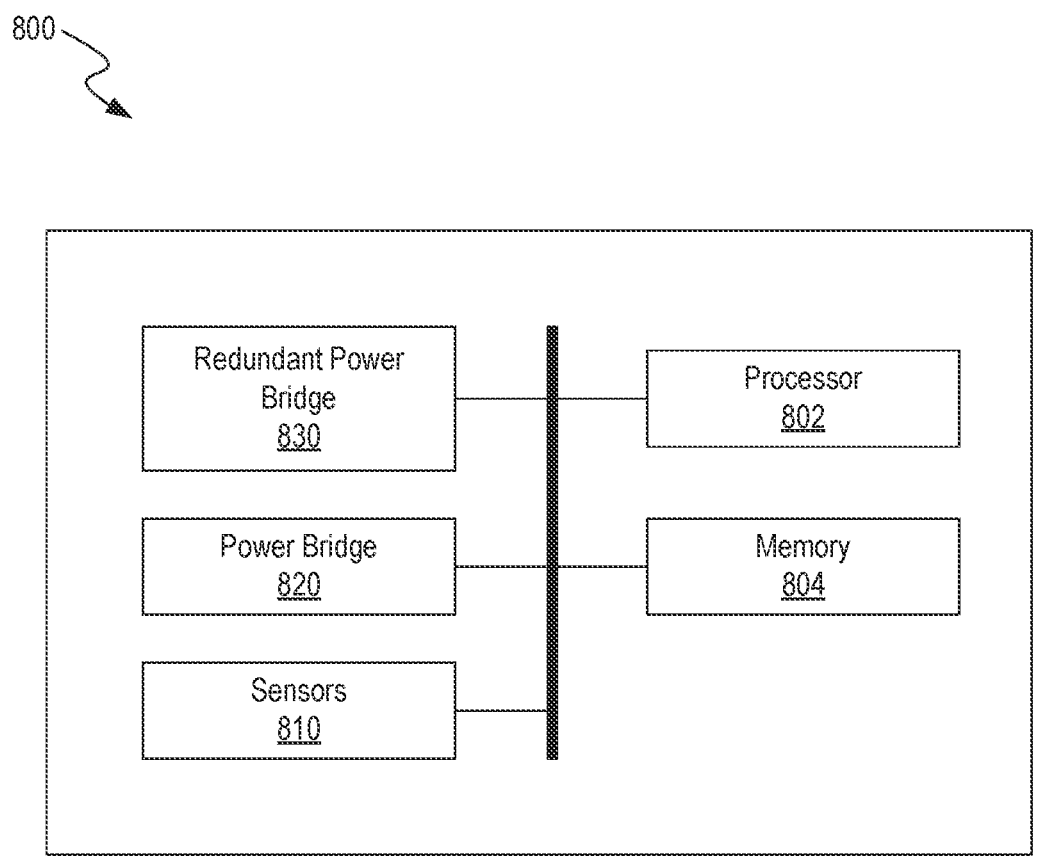
FIG. 8 shows an example of a hardware platform that can implement some methods and techniques described in the present document.

FIG. 8 shows an example of a hardware platform 800 that can be used to implement some of the techniques described in the present document. For example, the hardware platform 800 may implement method 700 or may implement the various modules described herein. The hardware platform 800 may include a processor 802 that can execute code to implement a method. The hardware platform 800 may include a memory 804 that may be used to store processor-executable code and/or store data. The hardware platform may further include sensors 810, a power bridge 820 and a redundant power bridge 830. In other embodiments, the memory 804 may comprise multiple memories, some of which are exclusively used by the navigation unit and/or the synchronization unit.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, e.g., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random-access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described, and other implementations, enhancements and variations can be made based on what is described and illustrated in this patent document.

What is claimed is:

1. A system for power distribution in a vehicle, comprising:
   at least one alternating current (AC) power source;
   at least one direct current (DC) power source;
   a first power bridge coupled to the at least one AC power source and the at least one DC power source;
   a second power bridge coupled to the at least one DC power source and at least one power distribution unit,
   wherein the first power bridge and the second power bridge comprise a plurality of sensors,
   and wherein the second power bridge comprises:
      a first terminal coupled to a first junction via a first controller switch;
      a second terminal coupled to the first junction via a second controller switch;
      a third terminal coupled to a second junction via a third controller switch; and
      a fourth terminal coupled to the second junction via a fourth controller switch,
   wherein the first junction and the second junction are coupled via a fifth controller switch,
   and wherein each of the first controller, the second controller, the third controller, the fourth controller, and the fifth controller switches being disconnected corresponds to the system being in a sleep mode, and
   wherein (a) at least one of the plurality of sensors is used to monitor a health of the system and (b) a single point failure is detected using the first power bridge and the second power bridge.

2. The system of claim 1, wherein the plurality of sensors comprises a temperature sensor, a voltage sensor, and a current sensor.

3. The system of claim 1, wherein the at least one AC power source comprises an alternator.

4. The system of claim 1, wherein the at least one DC power source comprises a first battery array and a second battery array.

5. The system of claim 1, wherein each of the first, second, third, and fourth controller switches being connected, the fifth controller switch being disconnected, and each of the plurality of sensors operating in a respective nominal range corresponds to the system being in a normal operating mode.

6. The system of claim 5, wherein the plurality of sensors monitoring the health of the system corresponds to the system being in a watchdog mode.

7. The system of claim 6, wherein the watchdog mode is configured to detect the single point failure that includes exactly one of a cable in the system being cut, short circuiting of one of the at least one DC power source, short circuiting of one of the at least one AC power source, a component in the system short circuiting, or a sensor of the plurality of sensors operating outside the respective nominal range.

8. The system of claim 1, wherein the vehicle is a semi-truck powered by lead-acid batteries operating with a nominal cell voltage of 12V or 24V.

9. A method of power distribution in a vehicle, comprising:
   determining that each of a plurality of sensors is operating within in a nominal range for the respective sensor; and
   distributing, based on the determining, power from at least one alternating current (AC) power source or at least one direct current (DC) power source to at least one power distribution unit,
   wherein a first power bridge is coupled to the at least one AC power source and the at least one DC power source and a second power bridge is coupled to the at least one DC power source and the at least one power distribution unit,
   wherein the first power bridge comprises a first switch and at least one of the plurality of sensors, wherein the plurality of sensors comprises a first temperature sensor that measures a temperature of a bar of a control unit and a second temperature sensor that measures a temperature of the first switch,
wherein the second power bridge comprises a second switch and at least one of the plurality of sensors and
wherein (a) at least one of the plurality of sensors is used to monitor a health of the vehicle and (b) a single point failure is detectable using the first power bridge and the second power bridge.

10. The method of claim 9, further comprising:
derating the first switch and each of the plurality of sensors.

11. The method of claim 10, further comprising:
detecting the single point failure upon a determination that at least one sensor of the plurality of sensors is operating outside a nominal range of the respective sensor, wherein the nominal range is based on derating the at least one AC power source or the at least one DC power source.

12. The method of claim 9, wherein a current limit of the first switch exceeds 300 amperes.

13. A system for power distribution in a vehicle, comprising:
a power bridge comprising a plurality of sensors that is used to (a) monitor a health of the system and (b) detect a single point of failure in the power distribution, wherein the plurality of sensors comprises a first temperature sensor that measures a temperature of a bar of at least one control unit and a second temperature sensor that measures a temperature of one of a plurality of controller switches;
an alternator that is a first distance from the power bridge and is coupled thereto;
a shore power unit that is a second distance from the power bridge and is coupled thereto, wherein the second distance is less than the first distance;
a first battery that is a third distance from the power bridge and is coupled thereto, wherein the third distance is less than the second distance; and
a second battery that is a fourth distance away from the power bridge and is coupled thereto, wherein the fourth distance is less than the third distance, and
wherein the power bridge is configured to monitor the health of the system and detect a single point of failure in the power distribution.

14. The system of claim 13, wherein the at least one control units comprises:
a first controller unit connecting the shore power unit and a first junction, the first controller unit comprising a first controller switch that includes the plurality of sensors;
a second controller unit connecting the first battery and a second junction, the second controller unit comprising a second controller switch;
a third controller unit connecting the first junction and the second battery, the third controller unit comprising a third controller switch;
a fourth controller unit connecting the alternator and the second junction; and
a fifth controller unit connecting the first junction and the second junction.

15. The system of claim 14, wherein each of the first, second, and third controller switches being disconnected corresponds to the system being in a sleep mode.

16. The system of claim 15, wherein the system transitions from the sleep mode to a mode selected from a group consisting of a power charging mode, a power manual mode, a power error mode, and a no power mode.

17. The system of claim 16, wherein the system is configured to transition to the sleep mode upon a determination that the system has been running in the no power mode for a predetermined duration of time.

* * * * *